United States Patent [19]

Linsker et al.

[11] Patent Number: 4,571,451
[45] Date of Patent: Feb. 18, 1986

[54] METHOD FOR ROUTING ELECTRICAL CONNECTIONS AND RESULTING PRODUCT

[75] Inventors: Ralph Linsker, Scarsdale; Roger S. Rutter, Vestal, both of N.Y.

[73] Assignee: International Business Machines Corporation, Armonk, N.Y.

[21] Appl. No.: 616,869

[22] Filed: Jun. 4, 1984

[51] Int. Cl.⁴ .............................................. H05K 1/00
[52] U.S. Cl. .................................... 174/68.5; 29/829; 361/409; 361/416
[58] Field of Search ............... 174/68.5; 361/409, 410, 361/414, 416; 29/829, 830, 831

[56] References Cited

U.S. PATENT DOCUMENTS

| | | | |
|---|---|---|---|
| 3,567,914 | 3/1971 | Neese et al. | 235/151.1 |
| 3,942,187 | 3/1976 | Henricus et al. | 357/71 |
| 4,202,007 | 5/1980 | Dougherty et al. | 174/68.5 |
| 4,295,198 | 10/1981 | Copeland et al. | 364/515 |
| 4,320,438 | 3/1982 | Ibrahim et al. | 361/401 |
| 4,458,297 | 7/1984 | Stopper et al. | 361/410 |

OTHER PUBLICATIONS

IBM "Technical Disclosure Bulletin", vol. 13, No. 8, Jan. 7, 1971, p. 2436.
IBM "Technical Disclosure Bulletin", vol. 24, No. 11a, Apr. 1982, pp. 5558-5560.

Primary Examiner—A. T. Grimley
Assistant Examiner—Morris H. Nimmo
Attorney, Agent, or Firm—Sughrue, Mion, Zinn, Macpeak, and Seas

[57] ABSTRACT

A method for establishing interconnections in the vicinity of congested clusters of pins in a printed circuit using an extended escape region in combination with an escape region and a global region. The extended escape region includes wire path segments in one signal plane of a plane pair which may enter the extended escape region from the escape region in a direction angularly disposed to the predominant direction of wiring in that plane. All wire segments exit the extended escape region to said global region in the predominant direction for the signal plane on which the interconnection is disposed.

14 Claims, 5 Drawing Figures

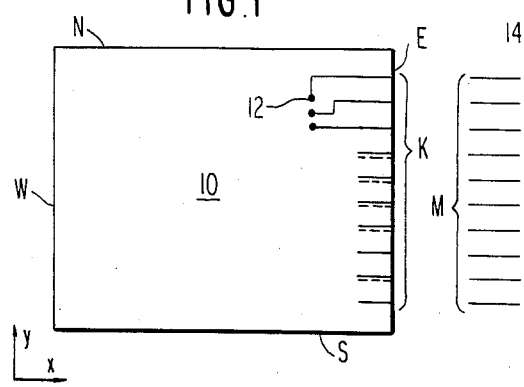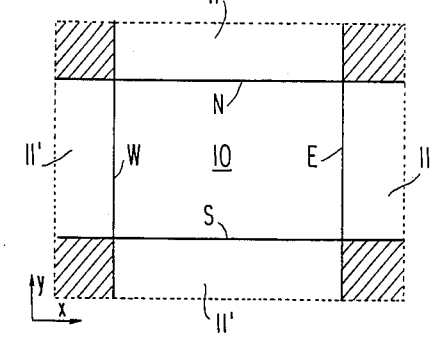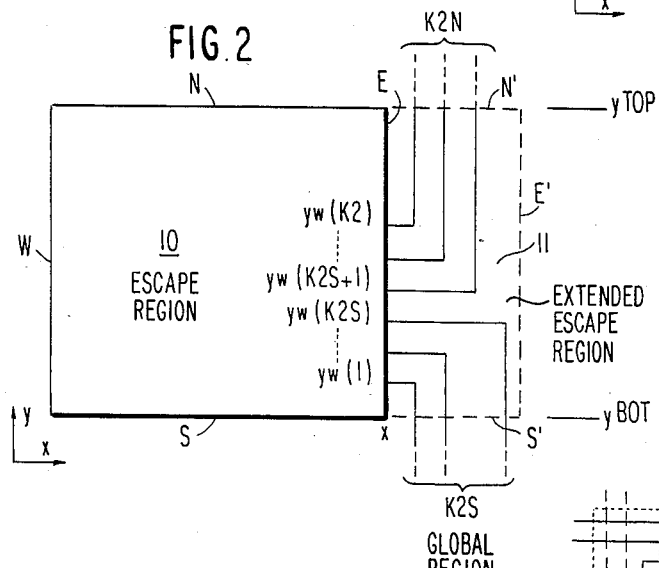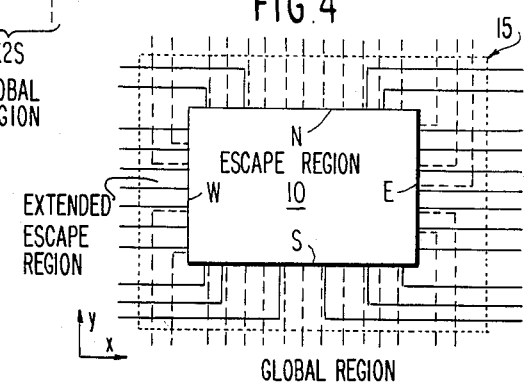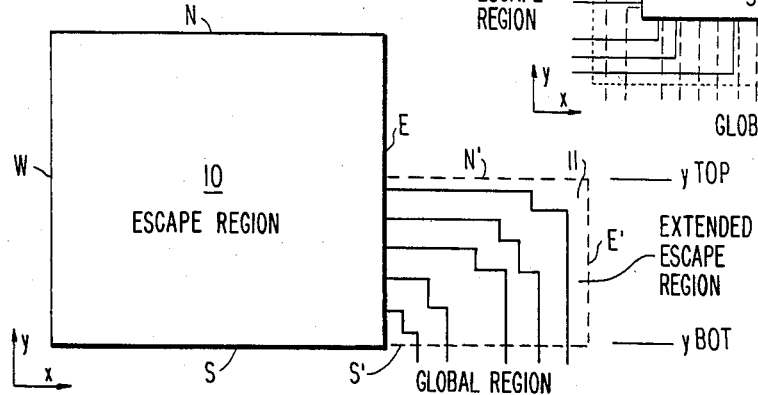

METHOD FOR ROUTING ELECTRICAL CONNECTIONS AND RESULTING PRODUCT

BACKGROUND OF THE INVENTION

1. Field of the Invention

This invention relates to a method for routing electrical connections between components on an integrated substrate or on an interconnection board and the resulting product. Electrical interconnections of the individual components on large or very large scale integrated circuit and interconnection packages are achieved using metallic wiring paths between points (or pins) to be connected. Each set of pins to be interconnected, and by extension, the wiring paths connecting those points are call a net. When the net is separated into routings from pin-to-pin, the individual pin-to-pin parts of the nets are called connections. It is possible in some schemes for the wiring path to be part of more than one connection. The paths are formed on one or more surfaces called planes (also referred to as "wiring planes" or "signal planes"). Several planes make up the substrate or board. Connections are usually decomposed into a sequence of horizontal, vertical and inter-plane segments. Usually the vertical wire path segments, i.e., those travelling parallel to the y-axis, are predominantly located on one or more planes labelled the "y" planes; while horizontal wire path segments, i.e., those travelling parallel to the x-axis, are predominantly located on different planes, labelled "x" planes. The preferred direction of wiring in a plane is in a direction parallel to the axis of that plane. Each potential wiring path site on a plane is referred to as a "track". The wire segments, etched or drilled, between planes are called vias. Vias can be of two types: thru vias and partial (or segmented) vias. Thru vias pass thru the entire board, and thus permit interconnection of wire segments on any planes of the board. Thru vias are often identical to the holes thru which the pins of the components are mounted on the board. Partial vias exist in two forms: (1) a link between arbitrary planes of length the distance between the planes, or (2) a link between certain adjacent planes. Two signal planes having angularly disposed wiring tracks, and particularly when linked by partial vias, are referred to as a "plane-pair".

A signal plane may have one or more "escape regions". The remainder of the plane is referred to as the "global region". An escape region differs from the global region in that it is a contiguous area whose boundary coincides with the rectangle enclosing the pins of one or possibly more components mounted (or to be mounted) on the board. The work "pins" is used here in the sense of end points of connections. An area encompassing a dense set of test points or the area encompassing the points of exit from the board are escape regions.

Possibly associated with an escape region is an "escape problem". An escape problem exists when the number of connections which must enter or leave an escape region to connect to pins within the escape region approaches or exceeds the number of tracks which cross the perimeter of the escape region, counting only tracks in each plane's preferred routing direction. When an escape problem exists, the wire routing methods which are successful in the global region will not be successful in the escape region. With the recent advent of large components having many pins, the connection to pins within an escape region can be dominant over the connection between escape regions in determining the number of planes required to complete the wiring. The present invention relates to a method and resulting pattern for reducing the number of planes when escape problems determine the number of planes required.

2. Description of the Prior Art

The prior art solutions to the escape problem are: (1) avoid routing wires that do not connect to the component's pins; (2) increase the number of planes; (3) customize (for each component) an "escape pattern" out to a distance beyond the component where there are sufficient tracks for all interconnections to be continued by the normal routing strategy; and (4) specify an escape pattern that is the same for all similar components out to a sufficiently large distance as in (3).

The creation of a custom escape pattern for each component usually involves manual effort, increased turn-around time, and the risk of error. The use of a predefined escape pattern avoids the time and the potential for error after the initial definition, but all possible connections must be made, usually increasing the number of paths in the area. If only a single electrical connection per pin is brought to the perimeter, there may be a degradation of electrical performance for high-speed transitions if the net is not point-to-point but rather contains intermediate receivers. Further, the direction of the escape path within the escape pattern is random and therefore not optimized with respect to the overall direction of the net of which it is a part.

U.S. Pat. No. 3,567,914 issued Mar. 2, 1971 to Neese et al entitled: "Automated Manufacturing System", pertains to a wire routing apparatus which takes into account certain routing penalties for finding the most desirable route available for a particular path.

U.S. Pat. No. 4,320,438 issued Mar. 16, 1982, to Ibrahim et al, entitled "Multi-layer Ceramic Package" pertains to increasing component density in an interconnection package by assigning the pins of a component to different signal planes.

IBM "Technical Disclosure Bulletin", Volume 13, No. 8, January 1971, page 2436 describes a method of increasing packing density of monolithic storage chips by using time multiplexing techniques which result in fewer wires connected to the chip.

IBM "Technical Disclosure Bulletin", Volume 24, No. 11a, April 1982, pages 5558–5560 describes a semiconductor package having a minimum of wiring layers as a result of assignment of specified functions to particular signal planes.

SUMMARY OF THE INVENTION The number of signal planes on an interconnection board must be large enough to allow all wires exiting an escape region to be assigned to allowed wiring tracks in the remaining global region of the board. The invention describes a wire routing pattern that allows one to reduce the number of signal planes below that conventionally required, for cases in which the above constraint is the dominating one. The signal plane reduction can be by a factor of as much as two.

To be more specific, let the escape rectangle have sides parallel to the "x" and "y" directions of the wiring tracks in the global region. Suppose an escape pattern results in K escapes being made to the east edge of an escape rectangle, in a particular plane-pair. Consider the case in which K is greater than M, where M is the wiring capacity for east-bound wires in the global region. In present practice, the global region carries predominantly x-running wire in one plane, and y-running wire in the other plane of the plane-pair. In that case, not all K wires can be routed eastwardly from the escape boundary.

The consequence in that n, the number of plane-pairs, is required to be large enough so that, at every edge of every escape rectangle, the total number of wires that have escaped to that edge does not exceed the wiring capacity in the global region (n·M in the above example). Furthermore, the assignment of particular escapes to particular plane-pairs must be such that, for every planepair, the number of escapes to each edge does not exceed the global region wiring capacity for that plane-pair.

These are potentially very expensive constraints, in terms of both cost and fabrication yield, since they can lead to a requirement for more signal planes than would otherwise be needed.

The present invention reduces the number of signal planes that are required by the above constraint (i.e. that every escape "match up" with an available global-region wire track), by up to a factor of two. In realistic cases, this will typically mean that this "match-up" requirement at the escape boundaries will no longer be the relevant constraint in determining the minimum number of signal planes required.

This is accomplished without incurring the disadvantages, discussed above, of either a customized escape pattern or a predefined fixed escape pattern.

Plane reduction is accomplished by providing an "extended escape region", interposed between the conventional escape region and the global region. At the boundary between the conventional escape region and the extended escape region, wire paths enter the extended escape region with directions and plane assignments that are in general both in the "correct" direction (e.g. x-direction in the "x" signal plane) and in the "wrong-way" direction (e.g., x-direction in the "y" signal plane). The wiring pattern to be defined in the extended escape region has the property that all wiring paths exiting the extended escape region (and entering the global region) run in the "correct" direction only.

The wire paths entering the extended escape region (from the conventional escape region) are distributed between the two signal planes of the plane-pair such that the paths in one signal plane of the extended escape region run essentially parallel to one another and essentially in straight lines, while the paths in the other signal plane undergo changes in direction in accordance with a nested path configuration, so that no paths cross within a signal plane, no vias occur within the extended escape region, and each path portion exiting the extended escape region is joined to a corresponding path portion in the global region.

It is an object of the present invention to provide an extended escape region situated between an escape region and a global region which allow a reduction in the number of signal planes below that conventionally required for connecting all wires exiting an escape region to wiring tracks in the global region.

It is a further object of the present invention to provide an extended escape region which is compatible with any wiring geometry selected for the escape region.

The aforementioned and other objects and features of the invention will become apparent from the following description taken in conjunction with the drawings.

BRIEF DESCRIPTION OF THE DRAWINGS

FIG. 1 is a plan view of a portion of a signal plane-pair which shows the relationship of the global region and an escape region.

FIG. 2 shows a wiring pattern in one signal plane of an extended escape region according to the present invention in which the wiring paths are divided into two sets wherein a first set is nested and routed in a first direction and a second set is nested and routed in a second direction.

FIG. 3 shows an extended escape region on four sides of an escape region of an interconnection board.

FIG. 4 shows a wiring pattern in an extended escape region in both signal planes of a plane-pair according to the present invention.

FIG. 5 shows another wiring pattern in one signal plane of an extended escape region according to the present invention in which the escape paths are nested and routed in a single direction.

DESCRIPTION OF THE PREFERRED EMBODIMENTS

Now with reference to FIGS. 1 through 5, a detailed description of the preferred embodiments of the invention will be described.

FIG. 1 shows an escape region 10 depicted in two dimensions x and y for a signal plane-pair, wherein K escape wiring paths are made to the "east" (i.e., right side) boundary (E) of the escape region within the plane-pair. For purposes of this discussion, it will be assumed that "south" (S) corresponds to the lowermost boundary of the escape region 10 positioned at some value in the y-plane, e.g., $y_1$ and "north" (N) corresponds to the uppermost boundary of the escape region 10 at another value in the y-plane $y_2$, wherein $y_2$ is greater than $y_1$. Similarly, "west" (W) corresponds to the left boundary of the escape region at some value in the x-plane $x_1$ and east corresponds to the right boundary of escape region at another value in the x-plane $x_2$, wherein $x_2$ is greater than $x_1$.

For purposes of illustration only three wire paths are depicted extending interiorly from the boundary to a "cluster" of pins one of which is shown at 12. Of course, in actual practice a cluster of pins will be a very large number resulting in a congested pin grid area. It will be understood that the specific wire path configuration used within the escape region is not part of this invention. The present invention allows a circuit designer much freedom to route the wires in the escape region in any manner and/or geometry that is most suitable for his needs.

It is seen that M tracks of wire path capacity are available in the "x" signal plane in the global region, generally depicted at 14 in the proximate vicinity of the K wiring paths departing the east boundary of the escape region. Because of the usual constraint limiting the x-direction paths in the "y" plane, there are no available "x" tracks in the "y" plane of the open region. The single solid lines depict that a single wire path segment is leaving the escape region at that point in the x-plane on the east boundary of the escape region. The solid-dashed line pairs indicate that there are two wire path segments attempting to escape at that point in the plane-pair on the east boundary. Thus, the Figure schematically illustrates a total of K15 wire path segments attempting to escape but only M10 paths available in the global region as shown in the bracket labeled by M. If M is equal to or larger than K, all of the escape wiring paths can be routed to the global region. Even then, the methods described herein can be used to reduce wiring congestion by allowing better balancing of wire distribution between the two signal planes. However, where K is larger than M, as shown at the east boundary of FIG. 1 not all K wiring paths can be routed eastwardly from the escape region boundary. Assuming the tracks crossing the other boundaries are substantially occupied, this is clearly an escape problem, since the number of wires required to cross the escape region boundary is greater than the number of tracks crossing in the preferred direction of routing.

The present invention solves this problem by providing an "extended escape region" and routing wire paths therein in a manner specified below.

Assume that K and M have the same meaning as in the previous discussion i.e., K wires have escaped to the east edge of the escape region in a particular plane-pair and only M, where M is less than K, wire tracks run eastwardly from this edge in the x (east-west) plane of the global region. For purposes of this illustration, assume further that K is less than or equal to 2M.

The set of K wires is divided into two sets, of K1 and K2 wires each, where K1 and K2 are each no greater than M. The set of K1 wires are routed eastwardly in a first signal plane, the x-plane.

With reference to FIG. 2, the set of K2 wires is divided further into two sub-sets. A first sub-set of the K2 wire paths, K2N, are routed first eastwardly in an adjacent signal plane, the y-plane, then north, still in the y-plane. A second sub-set of wire paths K2S are routed first eastwardly in the y-plane, then south, still in the y-plane. The sub-sets of K2N and K2S wire paths are "nested" so that no crossings occur within the y-plane.

Thus, it is seen that wire path segments entering the extended escape region may be disposed either parallel or perpendicular to the predominant wiring direction. Every wire segment exiting the extended escape region is disposed in the predominant wiring direction for its respective signal plane.

The extended escape region depicted by 11 is the rectangle whose edges are the east edge E of the escape region, the extension N' of the north boundary of the escape region, a side E' located a distance L from the east edge E wherein L is equal to the greater of the distances taken up by K2N and K2S, and a fourth edge S' corresponding to an extension of the south edge of the escape region.

More specifically, the following description will refer to the wire routing of the K2 set at the east edge of an escape region, in one plane-pair. Again, "x" is the horizontal coordinate of the east edge of an escape region. K wires have been routed within the escape region to this edge by conventional methods.

K1 of these K wire paths, not shown, are routed eastwardly in the usual manner using tracks in the "x" signal plane to the boundary of the escape region, and then extended in the eastward direction to the boundary of the extended escape region, E'.

The remaining K2 wires are routed to the boundary, E, in the Y-plane. Since they are crossing E on the y-plane, they are horizontal wires which do not align with y-plane global tracks. The y coordinates of the tracks in the y-plane crossing E will be referred to as yw(1) through yw(K2) in ascending order. (In this case "w" is for "wrong-way", i.e., these paths are routed using x-direction segments in the "y" signal plane.) The coordinates are labeled such that each integer value of x and y corresponds to a single wiring track.

The K2 wire paths are divided into two subsets of K2S and K2N segments and will be routed in the manner described below, entirely in the y-plane. The southernmost of these wire paths is routed from (x, yw(1)) to (x+1, yw(1)) thence to (x+1, yBOT), where yBOT is the southern boundary S' of the extended escape region. The k'th of the wire paths is routed from (x, yw(k)) to (x+k, yw(k)), thence to (x+k, yBOT), for wire paths k=2, ..., K2S. The northernmost of the K2 wire paths is routed from (x, yw(K2)) to (x+1, yw(K2)) thence to (x+1, yTOP), where yTOP is the northern boundary N' of the extended escape region. The (K2−p)th of these wires is routed from (x, yw(K2−p)) to (x+p+1, yw(K2−p)), thence to (x+p+1, yTOP) for p=1, ..., (K2N−1).

To illustrate how small the encroachment on the global region may be using the present invention, consider an interconnection board which has, for example, 85% global region (i.e., 15% of the board area is occupied by escape regions). Suppose K is typically 1.1 times M (for each component). If K1=M, and K2N=K2S, then L=0.05 M. Thus, the escape region is extended on the average by 10%, in the x direction; i.e., the east and west boundaries, are extended by 5% in each direction. The total escape area therefore increases by a factor of $(1.10)^2 = 1.21$, hence from 15% to 18%. The global area thus decreases from 85% to 82% of the board area, a relatively small decrease.

The above description has referred to only one edge, the east edge, of the escape region for purposes of simplicity. The method according to the present invention may be used for all edges of escape regions that may benefit from an extended escape region. Different plane-pairs may, in general, have different extended escape regions. Extended escape regions are defined in an entirely analogous way when required for the north, west and south edges of the escape region. For wiring exiting the north or south edges of an escape region, the roles of the x-plane and y-plane are interchanged. For wiring exiting the west edge, the roles of "east" and "west" are interchanged.

FIG. 3 shows an extended escape region where all four sides of the escape region are extended according to the present invention. Note that the four "corners", shown as shaded areas, may be included in the extended escape region or may be considered part of the global region at the option of the circuit designer.

FIG. 4 shows an example of how the wiring paths may look in the x- and y-planes of an extended escape region according to the present invention wherein the solid wiring is in the x-plane and the dashed wiring is in the y-plane and the dotted rectangle 15 shows an extended escape region including the four corner areas.

It is possible to choose K1 and K2 in accordance with various strategies to achieve various goals. The following examples are provided for purposes of illustration only.

A balance of x and y plane wire track loads in the global region can be achieved by selecting K1 and K2 appropriately. For example, if K1=K2, the wire paths will be distributed equally in the two signal planes.

To keep the escape extension distance L as small as possible, so that the extended escape region encroaches relatively little on the global region, select K1=M so that K2=K−M and K2N=K2S=K2/2. Then L=(K−M)/2. Obviously, if K2 is an odd number, these expressions are changed so that all values remain integral.

If the component placement is such that one wants more wires to exit from one border of the extended region to facilitate wire routing in the global region, choose, for example, K2S greater than K2N.

In an extreme case, one may wish to route all of the wire paths in the y-plane in one direction, for example south. Then, the extended escape region will be as shown in FIG. 5.

One has complete freedom to assign any particular escape to the K1 or to the K2 group. This freedom can be used to route a wire path in the extended escape region in the direction that is more appropriate to a particular interconnection net of which it is a part.

The wire routings in one of the planes in the extended escape region for a plane-pair have been depicted as 'L'-shaped for simplicity of description, and as a particular embodiment of the invention. Other wire routings can be used in accordance with the present invention, which avoid crossings within a plane, and which result in all wires running in the preferred direction (within their respective planes) at the boundary between the extended escape and the global regions. An example of such a routing is a 'staircase' configuration, in which each wire runs alternately in both directions without changing planes.

Although the invention has been described and shown in terms of preferred embodiments thereof, it will be understood by those skilled in the art that changes in form and details may be made therein without departing from the spirit and scope of the invention.

Having described the invention in terms of preferred embodiments, we claim:

1. In a wiring interconnection structure having at least one plane-pair for routing connections between pins; each said plane-pair including a signal plane having connections disposed in a preferred direction parallel to a first axis and an adjacent signal plane having connections disposed in a preferred direction predominantly parallel to a second axis, said second axis being perpendicular to said first axis; a wiring pattern on said plane-pair comprising:
   at least one escape region of the plane-pair, defined by a rectangular boundary, containing a cluster of pins and escape segments of the connections in both signal planes, each escape segment extending from one of said pins in said cluster to said escape region boundary;
   at least one extended escape region of the plane-pair, defined by a rectangular boundary, wherein one side of the extended escape region is co-located with at least a portion of a side of the escape region boundary; each extended escape region containing extended escape segments of said connections, each extended escape segment being connected to and extending from an end of an escape segment of said connection at said escape region boundary, co-located with said extended escape region boundary, to another side of said extended escape region adjacent to a global region of the plane-pairs, without changing signal planes, said extended escape segments proximate to said global region being disposed in the preferred direction of its respective signal plane; and
   said global region of the signal-plane having global segments of the connections wherein each of said global segments comprises portions of the connections that do not lie within any escape region or extended escape region.

2. The structure of claim 1 wherein said extended escape segments are divided into two sets wherein a first set is routed in one signal plane directly across said extended escape region in a preferred direction of said signal plane and a second set is routed in the other signal plane of the same plane-pair using both the non-preferred and the preferred direction in said other signal plane.

3. The structure of claim 2 wherein said second set is nested so that the extended escape segments do not intersect.

4. The structure of claim 2 wherein said second set is routed alternately parallel to each of said two axes to form a staircase configuration.

5. The structure of claim 4 wherein said second set is nested so that the extended escape segments do not intersect.

6. The structure of claim 3 wherein said extended escape segments are substantially L-shaped.

7. The structure of claim 2 wherein said second set is divided into two sub-sets wherein both sub-sets initially are routed parallel to said first axis; and then, one of said sub-sets is routed parallel to said second axis in one direction and the other sub-set is routed parallel to said second axis in a direction opposite that of said first sub-set.

8. A method for routing connections in a multiple-plane wiring interconnection structure, said planes arranged in plane-pairs wherein a first signal plane in each of said plane-pairs has connections predominantly disposed in a direction parallel to a first axis associated with that signal plane and an adjacent signal plane of said plane-pair has connections disposed in a direction parallel to a second axis associated with said adjacent signal plane, said second axis being perpendicular to said first axis, comprising:
   routing an escape segment of each of said connections from a pin in a congested pin area to a boundary of an escape region surrounding said congested pin area;
   routing an extended escape segment of each of said connections between an end of said escape segment at said escape region boundary to a boundary defining an extended escape region, so that each said extended escape segment terminates at the extended escape region boundary in a direction parallel with the axis associated with the signal plane in which the connection is disposed; and
   routing a global segment of each of the connections from an end of the extended escape segment at said extended escape region boundary through a global region.

9. The method of claim 8 wherein the step of routing said extended escape segments within a plane-pair includes the further steps of dividing said extended escape segments into two sets; routing a first set of said extended escape segments in a first signal plane in a direction parallel with the axis associated with that signal plane, directly from said border of said escape region to said border of said extended escape region; and, routing a second set in the second plane of said plane-pair using both the wiring direction parallel to the axis associated with said first signal plane and the direction parallel to the axis associated with said second signal plane.

10. The method of claim 9 comprising the further step of nesting said second set so that there are no intersections.

11. The method of claim 9 comprising the further step of dividing said second set into two sub-sets and routing both sub-sets in said second signal plane in a direction initially parallel to said first axis and then routing said first sub-set in a direction parallel to the axis associated with said second signal plane and routing said second sub-set in a direction parallel to the axis associated with said second signal plane but in a direction opposite from that of said first sub-set.

12. The method of claim 11 comprising the further step of nesting said two sub-sets so that there are no intersections.

13. The method of claim 8 comprising the further step of routing said second set alternately parallel with both axes in a staircase configuration.

14. The method of claim 13 comprising the further step of nesting said second set so that there are no intersections.

* * * * *